United States Patent [19]
Gould

[11] Patent Number: 6,008,092
[45] Date of Patent: Dec. 28, 1999

[54] SHORT CHANNEL IGBT WITH IMPROVED FORWARD VOLTAGE DROP AND IMPROVED SWITCHING POWER LOSS

[75] Inventor: Herbert J. Gould, Sherman Oaks, Calif.

[73] Assignee: International Rectifier Corporation, El Segundo, Calif.

[21] Appl. No.: 08/786,023

[22] Filed: Jan. 21, 1997

Related U.S. Application Data

[60] Provisional application No. 60/011,492, Feb. 12, 1996.

[51] Int. Cl.$^6$ .................................................. H01L 21/336
[52] U.S. Cl. .......................................... 438/268; 257/345
[58] Field of Search ............................................. 438/268

[56] References Cited

U.S. PATENT DOCUMENTS

| | | |
|---|---|---|
| 4,134,778 | 1/1979 | Sheng et al. . |
| 4,716,126 | 12/1987 | Cogan . |
| 4,757,032 | 7/1988 | Contiero . |
| 4,792,530 | 12/1988 | Nilarp . |
| 5,016,066 | 5/1991 | Takahashi . |
| 5,124,772 | 6/1992 | Hideshima et al. . |
| 5,227,315 | 7/1993 | Frisina et al. . |
| 5,472,888 | 12/1995 | Kinzer . |

FOREIGN PATENT DOCUMENTS

| | | |
|---|---|---|
| 0118921 | of 1984 | European Pat. Off. . |
| 0335750 | of 1989 | European Pat. Off. . |
| 0405422 | of 1990 | European Pat. Off. . |
| 0417738 | of 1990 | European Pat. Off. . |
| 0570595 | of 1998 | European Pat. Off. . |
| 19511382 | of 1995 | Germany . |
| 4229660 | of 1992 | Japan . |
| 7074356 | of 1995 | Japan . |
| 2243952 | of 1991 | United Kingdom . |

*Primary Examiner*—John F. Niebling
*Assistant Examiner*—Jonathan Hack
*Attorney, Agent, or Firm*—Ostrolenk, Faber, Gerb & Soffen, LLP

[57] ABSTRACT

A cellular insulated gate bipolar transistor ("IGBT") device has a reduced length of the channels of the individual cells that is formed by reducing the channel drive in time from the customary 120 minutes at 1175° C. to between 60 and 90 minutes at 1175° C. The process also permits the use of a higher minority carrier lifetime killing electron radiation dose to improve switching power loss while reducing SOA by only a small value. Alternatively, the increased concentration region located in the active region between spaced bases is initially driven in at a temperature of about 1175° C. for about 12 hours, rather than the customary 8 hours, and the channel drive in time is reduced from 120 minutes to 60 minutes. The shorter channel length, when combined with the deeper enhancement region, allows for higher lifetime electron irradiation doses or heavy metal diffusion temperatures.

12 Claims, 2 Drawing Sheets

PRIOR ART

SHORT CHANNEL IGBT WITH IMPROVED FORWARD VOLTAGE DROP AND IMPROVED SWITCHING POWER LOSS

RELATED APPLICATIONS

The application claims the benefit of U.S. Provisional Application No. 60/011,492, filed Feb. 12, 1996.

FIELD OF THE INVENTION

The present invention relates to a process for the manufacture of IGBTs and the resulting structure. More specifically, the present invention relates to an IGBT with reduced channel length or deeper enhanced concentration region that improves $V_{ce,on}$ and that improves switching power loss.

BACKGROUND OF THE INVENTION

Insulated gate bipolar transistors (IGBTs) are well known and a typical structure and process of manufacture is described in co-pending U.S. patent application Ser. No. 08/316,112, filed on Sep. 30, 1994 (IR-1199), which is a continuation of Ser. No. 08/041,136, filed on Mar. 30, 1993 and now abandoned, which is a continuation of Ser. No. 07/521,177, filed on May 9, 1990 and now abandoned, the subject matter of which is incorporated herein by reference; and in British Patent No. 2,243,952 (IR-988). The channel length in such devices is typically that produced by a channel drive in of boron having an implant dose of 6 E15 per $cm^2$ followed by a drive for approximately 120 minutes, and followed again by an arsenic source implanted at 3 E15per $cm^2$ and driven in at about 975° C.

This process has produced commercially acceptable IGBT devices with given forward voltage drops and switching power losses. Such devices are made by the International Rectifier Corporation of El Segundo, California.

It is always desirable to reduce the forward voltage drop of an IGBT and to decrease its switching power loss, namely to increase its; safe operating area (SOA). It is also desirable to reduce the minority carrier lifetime ("lifetime killing") to increase the switching speed of the IGBT by reducing the lifetime of the minority carriers in the silicon. Though electron irradiation may be used to reduce minority carrier lifetime, the dose that can be irradiated into the IGBT must be less than 4 megarads to avoid "switchback" and is typically less than 3 megarads.

It is therefore desirable to provide a process which permits a substantial reduction in both forward voltage drop and SOA and allows electron irradiation at higher doses without switchback.

Moreover, the effect of the irradiation can be annealed out at die bond temperatures. The device must therefore be subsequently soldered at lower temperatures to avoid this annealing, which complicates the assembly process. Therefore, doping with a heavy metal, such as platinum or gold, is preferred for lifetime killing. However, heavy metal doping increases the apparent resistivity in the active region between bases.

It is therefore also desirable to be able to use heavy metal doping in an IGBT without increasing forward voltage drop above that of a comparable electron irradiated IGBT.

BRIEF DESCRIPTION OF THE INVENTION

The present invention reduces the channel length of the channels of individual cells of a cellular IGBT by reducing the channel drive in time from the customary 120 minutes at 1175° C. tc between 60 and 90 minutes at 1175° C. The process also then permits the use of a higher minority carrier lifetime killing electron radiation dose of 4 megarads instead of the prior art 3 megarad to improve switching power loss while reducing SOA by only a small value. The device source is then formed by an arsenic source implanted at 3 E15 followed by an anneal temperature greater than about 975° C. The new process reduces forward voltage drop or, alternatively, switching speed by about 20%. The SOA is thus reduced by only 21 microseconds to 16 microseconds which is well within guaranteed withstand time for commercial IGBTs.

Alternatively, the present invention reduces forward voltage drop and switching loss by increasing the enhancement diffusion time to 12 hours and by reducing the channel drive in time from 2 hours to 1 hour. This process likewise permits the use of a higher lifetime killing electron radiation dose of about 5 to 6 megarads for a 1200 volt IGBT device and of about 6.4 to 16 megarad dose for a 600 volt IGBT device. The process also permits the use of higher temperature lifetime killing platinum diffusion.

In accordance with the present invention, a power semiconductor device is manufactured by introducing carriers of a first conductivity type into the exposed surface of a thin semiconductor chip of the first conductivity type. The carriers are diffused to a first depth into the substrate to form a region of increased concentration. A first mask layer having openings which overlie the region of increased conduction is formed, and a first given concentration of carriers of a second conductivity type opposite to that of the first conductivity type is applied to the chip surface through the openings. A thin gate dielectric and a conductive gate electrode are formed over at least portions of the surface of the region of increased concentration. A second mask layer having openings is formed. The openings surround and are at least adjacent to the locations of respective first mask layer openings and are bounded by respective areas of the thin gate dielectric. A second given concentration of carriers of the second conductivity type, which is less than the first given concentration, is introduced through the second mask layer openings. The carriers of first and second given concentration are then diffused at about a temperature of 1175° C. for a time ranging from 60 to 90 minutes. The carriers of the first given concentration form a body of relatively high concentration, and the carriers of the second given concentration channel region form a relatively low concentration channel region which surrounds the body of relatively high concentration and underlies the thin gate dielectric. A high concentration of carriers of the first conductivity type is introduced through the second mask opening and diffused to form shallow source regions. The shallow source regions diffuse laterally to underlie the thin gate dielectric and bound the inner edge of the low concentration channel. A source electrode is formed on the source regions as is a drain electrode which is electrically connected to the chip.

In accordance with this aspect of the present invention, a further mask layer maybe formed prior to the step of introducing the carriers of the first conductivity type. The first mask layer has openings through which the carriers of the first conductivity type are introduced into the exposed surface of the chip.

The carriers of the first type that are introduced into the exposed surface of the chip may be diffused to a final depth which is reached by a diffusion at about 1175° C. for about 12 hours.

The carrier lifetime of the chip may be reduced. The completed chip may be exposed to a radiation dose of about 4 megarad, or a dose of about 5 to 16 megarads.

Heavy metal atoms may bes diffused into the chip to kill carrier lifetime. The heavy metal atoms may be platinum atoms which are diffused at a temperature of about 955° C. or at a temperature of about 960° C. to 970° C. The heavy metal atoms may alternatively be gold atoms.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which.

DETAILED DESCRIPTION OF THE DRAWINGS

Figure 1:
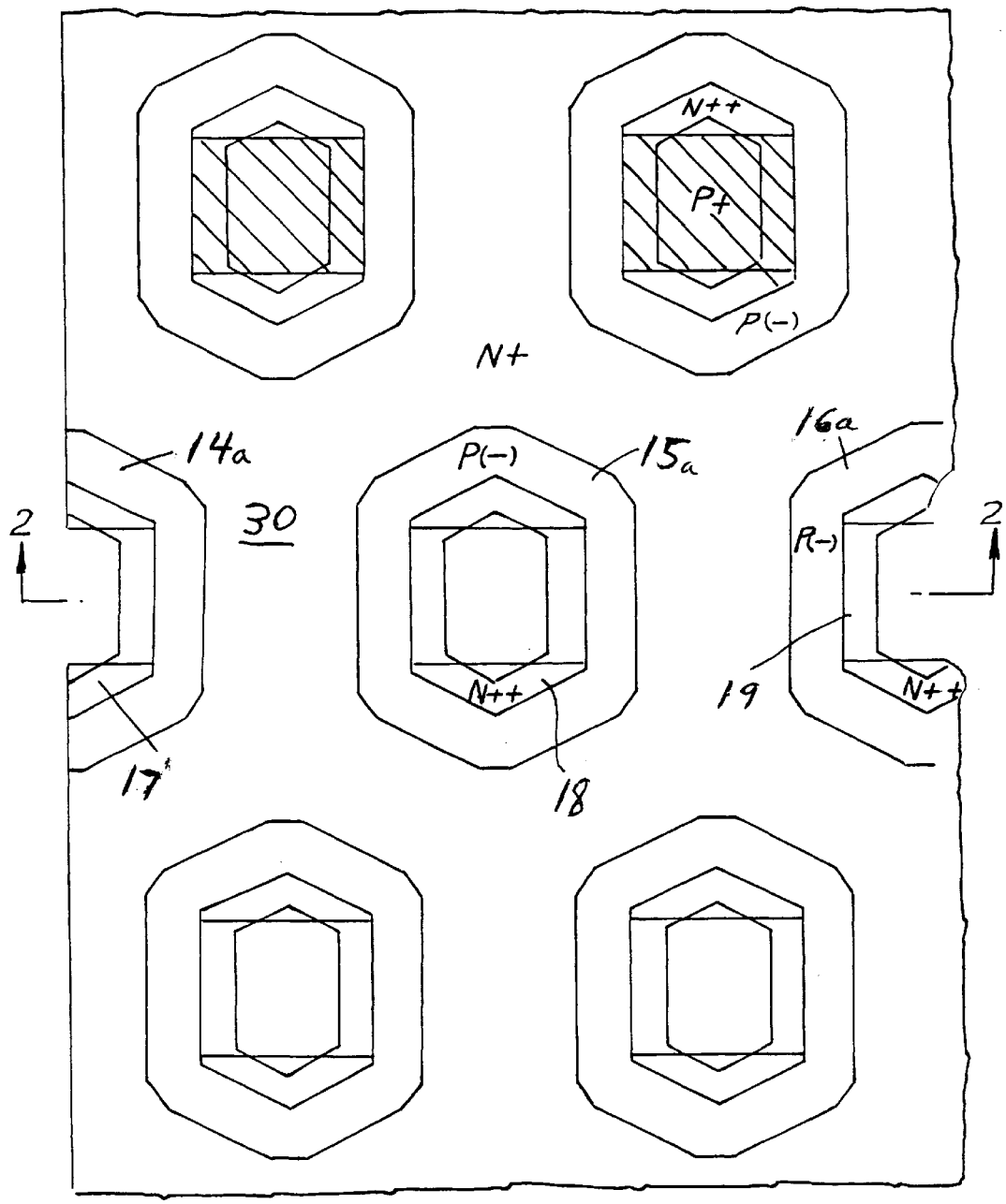
FIG. 1 is a top view of the silicon surface of a cellular IGBT device.
Figure 2:
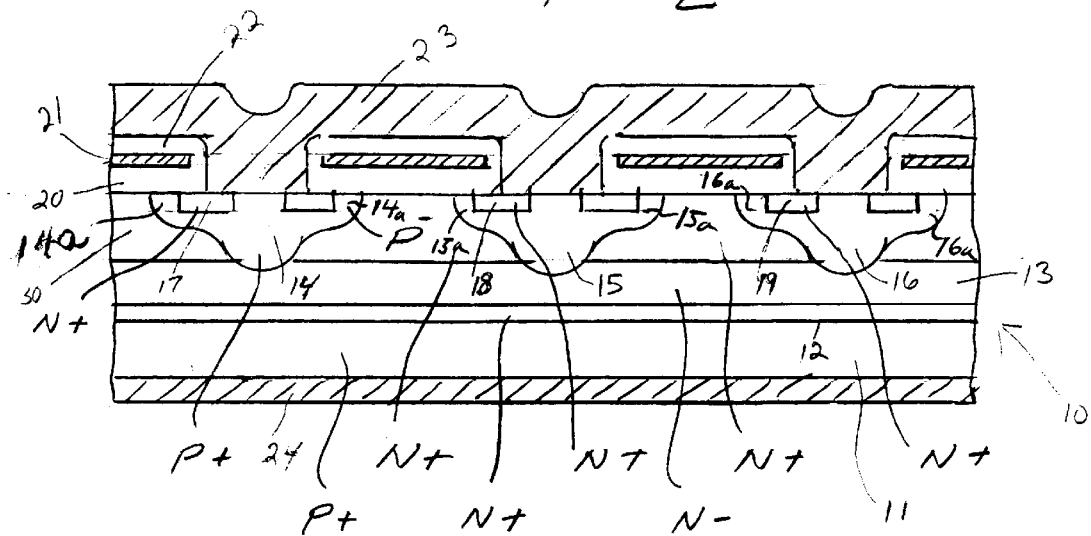
FIG. 2 is a cross-sectional view of FIG. 1 taken across the section line 2—2 and shows the active area of several cells of the cellular IGBT.

Referring first to FIGS. 1 and 2, there is shown a portion of the active area of a typical IGBT device. Only a few of the large number of hexagonal cells in the IGBT device are shown. The IGBT device comprises a silicon wafer 10 having a P+ substrate 11, a thin N+ buffer layer 12, and N− epitaxial junction receiving layer 13, a plurality of P type spaced bases 14, 15 and 16 which are preferably polygonal in topology and which contain respective annular source regions 17, 18 and 19 respectively. The surface area between the outer periphery of each source 17, 18 and 19 and the outer periphery of respective bases 14, 15 and 16 respectively defines respective annular invertible channel areas.

The invertible channel areas are covered by a polygonal web of gate oxide 20 which is in turn covered by a polysilicon gate layer 21. The gate layer 21 is covered by a low temperature oxide ("LTO") insulation layer 22. An aluminum emitter contact 23 is then formed atop the LTO 22 and a collector contact 24 is connected to the bottom of substrate layer 11.

In known processes, such as that of the aforementioned co-pending application Ser. No. 08/316,112, the wafer 10 shown in FIG. 2 has flat parallel upper and lower surfaces and has a substrate 11 of boron doped P+ material having a thickness for example of 15 mils. The P+ material is doped to a resistivity of, for example, less than about 0.02 ohm centimeter. A thin epitaxially grown N+ layer 12 is grown atop the P+ substrate 11. Region 12 could also be a region which is diffused into substrate 11 or could be formed by direct wafer bonding.

A second epitaxial layer which defines the main voltage blocking region of the device is the N− layer 13 into which all diffused junctions are formed and is typically doped with phosphorus.

The first processing step on the wafer 10 is the formation of a thin oxide layer (not shown) having a thickness of, for example, about 400 angstroms. A conventional photoresist is applied to the top surface of oxide layer and is patterned to a mesh-type pattern. The exposed portion of the thin oxide layer is then etched away and results is the formation of a plurality of rectangular oxide islands. Phosphorus is then implanted into the silicon through the oxide window pattern using the photoresist to mask the implant of the atoms. As an example, the phosphorus implant is carried out at an accelerating energy of about 120 key and at a preferred dose of about 3 E12, though the dose can range between about 2 E12 and 7 E12. Alternatively, the oxide is not etched and the phosphorus is implanted at a higher energy through the thin oxide into the silicon.

As a further alternative, a uniform blanket implant of phosphorus is first applied to the bare silicon surface over the active regions of the die prior to the growth of the thin oxide.

After stripping the photoresist, the phosphorous implant is next driven deep below the surface of N− region 13 to form an ultra-deep N+ "enhancement" region 30. In the known processes, the initial ultra-deep N+ "enhancement" implant is followed by a very long drive time, typically about 8 hours.

In the next step in the process, an oxide layer is grown atop the surface of the wafer, and a photoresist layer is deposited atop and then appropriately patterned to define windows. The oxide and the underlying thin oxide are then etched through the spaced windows in the photoresist to expose the silicon surface. Thereafter, the photoresist is removed and a heavy boron dose is implanted deep into the exposed silicon surface areas to form the deep central body portions of regions 14, 15 and 16 in FIG. 2. As an example, the boron implant is carried out at an acceleration voltage of about 50 key with a dose of about 6 E15. Following the implant step, in the conventional process, there is a short initial drive of the implant, typically in dry nitrogen plus 1% oxygen, to obtain an initial drive of 1–2 micrometers.

Thereafter, oxide segments are grown over the P+ regions 14, 15 and 16. The P+ regions are initially driven for a short depth to avoid a substantial depletion of the surface boron during the growth of these oxide segments. A photoresist layer is then deposited atop the surface and patterned to define a window pattern by which all oxide except that overlying the P+ regions 14, 15 and 16 is etched away. The photoresist layer is subsequently removed and a thin gate oxide layer 20 is grown over the fully exposed active area of the wafer.

A polysilicon layer 21 is then deposited atop the wafer and a photoresist layer is deposited atop the polysilicon. The photoresist is then patterned according to another masking step forming openings and is used as a mask to etch the polysilicon, thus forming windows above the gate oxide layer 20. Thereafter, the gate oxide layer is etched which exposes the remaining polysilicon web and the surface of the silicon substrate, and boron is implanted through the diffusion windows. The boron dose here is about E13 at 50 key, much lower than that of the heavy boron dose. This boron dose, after diffusion, will merge with the higher-dose boron region and will form a low concentration P− type channel region 14a, 15a and 16a which surround and are shallower than the P+ body portions 14, 15 and 16 produced from the higher concentration implants. These regions are then typically driven in for about 2 hours at 115° C. to reach a depth of about 4.5 microns. Thus, lighter doped boron regions 14a, 15a and 16a, which are annular regions, are formed in FIG. 2, though it is clear that where these regions overlap the P+ regions 14, 15 and 16 they merge with one another.

The P(−) shallow "shelves" 14a, 15a and 16a, which surround deep P+ regions 14, 15 and 16 are lightly doped channel regions extending beneath the gate oxide.

It will be noted that, in each drive including the P− drive in, all junctions continue to move deeper. The N+ region 30 moves to a lesser degree, and P+ regions 14, 15 and 16 move to a somewhat larger degree. It is also known to those skilled in the art that as the diffusions drive deeper they also move laterally, whereby the shallow diffusions 14a, 15a and 16a ultimately diffuse under the gate oxide.

The surface is then appropriately de-glassed and arsenic atoms are implanted at, for example, 50 key at a dose of 3 E15 and are driven in at a temperature of 975° C. for approximately 120 minutes, for example, to form the annular N++ source regions 17, 18 and 19.

Thereafter, an interlayer silicon dioxide or LTO coating 22 is formed over the surface of the chip and is then coated with a photoresist layer which is photolithographically patterned to define a contact mask opening. The surface exposed through the openings in the photoresist is then appropriately etched to expose the underlying inner peripheral portions of the N++ sources 17, 18 and 19 and the central body of the P+ regions 14, 15 and 16. After removing the photoresist, a subsequently deposited aluminum layer is then photolithographically patterned arid etched to form source and gate electrodes (not shown). The aluminum emitter electrode 23 is a continuous electrode, which electrically connects each cell in parallel and shorts each of the P+ body regions and the inner periphery of their respective annular N++ source regions.

An amorphous silicon lazier (not shown) is then deposited over the surface of the wafer which is photolithographically patterned and etched to expose appropriate emitter and gate pads. During this operation, the amorphous silicon may be etched with a suitable plasma etch. Thereafter, material is removed from the bottom of the P+ layer 11, and a suitable collector electrode 24 is then attached to the bottom surface.

Figure 3:
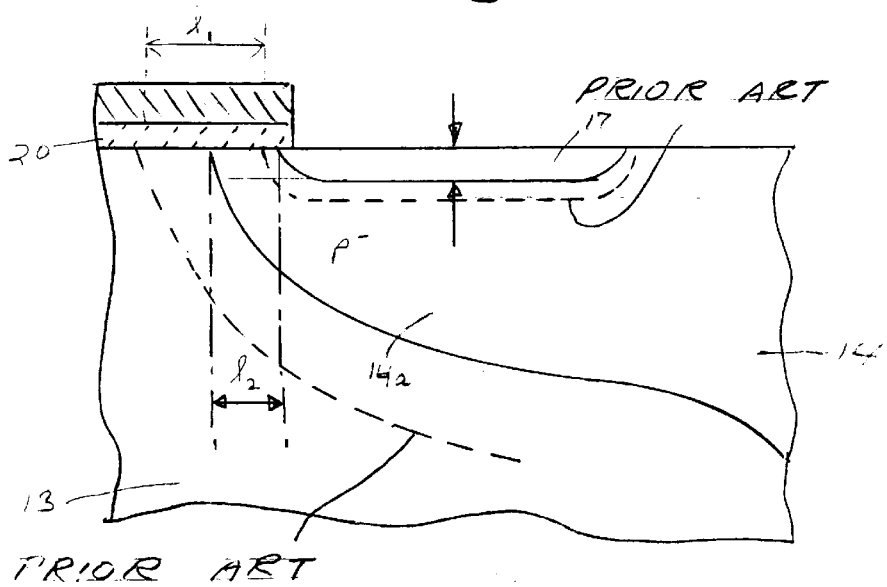
FIG. 3 shows an enlarged view of the channel area of one-half of one of the cells of FIG. 2 for both a known device as well as according to the invention.

This known process produces a junction pattern as shown by the dotted lines in FIG. 3. The junction pattern has a channel length is $l_1$, which is the distance between the edges of the source 17 and base 14 at the surface of region 13.

In accordance with a first aspect of the present invention, the drive in of the P− channel regions is reduced from 120 minutes at 1175° C. to a range of 60 to 90 minutes at 1175° C., and preferably about 90 minutes, which provides a smaller channel length $l_2$, shown in FIG. 3, resulting from the reduced lateral diffusion of the P− diffusion 14a, 15a and 16a.

The wafer is then subjected to lifetime killing by either electron irradiation or by heavy metal diffusion. For example, platinum lifetime killing can be used by diffusing platinum into the silicon wafer at from 960° C. to 970° C. Alternatively, ir accordance with the invention, the wafer may be irradiated to a increased 4 megarad total dose.

The new process has been found to reduce forward voltage drop or, alternatively, switching speed, by about 20%. Thus, device SOA is; reduced from about 21 microseconds to about 16 microseconds which is still within the guaranteed withstand time for commercial IGBTs.

Different source implant doses can be used for the N++ source regions 17, 18 and 19. Using a P− channel implant of 8 E13 that is driven in for 90 minutes, the process has been tested for a groap of 24 wafers. The test wafers were standard epitaxil wafers obtained from Sumitomo. The group was divided among two different enhancement diffusion drive-ins, namely 8 hours and 12 hours, respectively. Three values of source implant doses were also tested, 3 E15, 6 E15 and 1 E16, respectively, and four furnace platinum drive-in temperatures of 905° C., 910° C., 915° C. and 920°C., respectively, were also tested. The tests produced the following results shown in Table I in which the reverse breakdown voltage $BVD_{SS}$, the threshold voltage $V_{th}$ and the forward voltage drop $V_{ON}$ for these split lot experiments are listed. It should be noted that wafers obtained from other suppliers provide only slightly different results.

In accordance with another aspect of the present invention, the ultra-deep N+ "enhancement" region 30 is initially driven at a temperature of about 1175° C. for about 12 hours, rather than the customary 8 hours, and the low concentration P− type channel regions 14a, 15a and 16a are driven in at 1175° C. is reduced from 120 minutes to 60 minutes, resulting in a shorter channel length.

The shorter channel length, when combined with the deeper enhancement region, allows for even higher lifetime killing electron radiation doses of up to 5 to 6 megarads without switchback for a 1200 volt IGBT device and doses of about 6.4 to 16 megarads for a 600 volt IGBT device.

It has also been found that heavy metal doping, such as platinum diffused in at 955° C. for 10 minutes, may also be used to kill lifetime in place of irradiation while attaining acceptable forward voltage drops.

The process also reduces the blocking voltage by about 40 volts. It was found, however, that because of variation in the epitaxial layer thickness in the supplied wafers, this reduced blocking voltage occasionally resulted in devices that did not meet the 1200 volt specification. As a result, wafers having thicker epitaxial layers are required for this process.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

TABLE I

| HRS ENHANC. DRIVE | SOURCE IMPLANT DOSE | WAFER | FURN PT° C. | BVDss | Vth | 20 AMPS Von |
|---|---|---|---|---|---|---|
| 8 HRS | 3 E15 | 1 | SLOW | 1220 | 3.2 | 1.55 |
|  | 3 E15 | 2 | 905 | MIA | MIA | MIA |
|  | 3 E15 | 3 | 910 | 1220 | 3.6 | 2.55 |
|  | 3 E15 | 4 | 915 | 1230 | 3.6 | 2.75 |
|  | 3 E15 | 5 | 920 | 1240 | 3.7 | 2.75 |
|  | 6 E15 | 6 | 905 | 1240 | 3.4 | 2.15 |
|  | 6 E15 | 7 | 910 | 1230 | 3.3 | 2.35 |
|  | 6 E15 | 8 | 915 | 1230 | 3.4 | 2.80 |
|  | 6 E15 | 9 | 920 | 1240 | 3.45 | 3.00 |
|  | 1 E16 | 10 | 905 | 1190 | 3.6 | 2.00 |
|  | 1 E16 | 11 | 910 | 1180 | 3.25 | 2.10 |
|  | 1 E16 | 12 | 915 | 1200 | 3.45 | 2.40 |
|  | 1 E16 | 13 | 920 | 1230 | 3.4 | 2.30 |
| 12 HRS | 3 E15 | 14 | 905 | 1210 | 3.75 | 2.05 |
|  | 3 E15 | 15 | 910 | 1210 | 3.6 | 2.20 |
|  | 3 E15 | 16 | 915 | 1200 | 3.6 | 2.25 |
|  | 3 E15 | 17 | 920 | 1200 | 3.6 | 2.50 |
|  | 6 E15 | 18 | 905 | 1200 | 3.3 | 1.90 |
|  | 6 E15 | 19 | 910 | 1200 | 3.3 | 2.15 |
|  | 6 E15 | 20 | 915 | 1200 | 3.45 | 2.25 |
|  | 6 E15 | 21 | 920 | 1210 | 3.45 | 2.40 |
|  | 1 E16 | 22 | 905 | 1200 | 3.3 | 1.90 |
|  | 1 E16 | 23 | 910 | 1200 | 3.5 | 2.05 |
|  | 1 E16 | 24 | 915 | 1240 | 3.4 | 2.40 |

What is claimed is:

1. A method of manufacture of a power semiconductor device comprising the steps of:

introducing carriers of a first conductivity type into the exposed surface of a thin semiconductor chip which is of the first conductivity type and diffusing said carriers to a first depth into said substrate to form a region of increased conduction;

forming a first mask layer having openings which overlie said region of increased conduction and applying a first given concentration of carriers of a second conductivity type, which is of opposite conductivity type to said first conductivity type, to said chip surface through said openings;

forming a thin gate dielectric and a conductive gate electrode over at least portions of the surface of said region of increased conduction;

forming a second mask layer having openings which surround and are at least adjacent to the locations of respective ones of said first mask layer openings and bounded by respective areas of said thin gate dielectric, and introducing a second given concentration of carriers of the second conductivity type, which is less than said first given concentration, to said chip through said second mask layer openings;

diffusing said carriers of said first and second given concentrations of said second conductivity type at about a temperature of 1,175° C. for a time ranging from 60 to 90 minutes, with said carriers of said first given concentration forming a body of relatively high concentration and said carriers of said second given concentration forming a relatively low concentration channel region which surrounds said body of relatively high concentration and underlies said thin gate dielectric, said diffusion permitting increased lifetime killing treatment;

introducing a high concentration of carriers of said first conductivity type through said second mask openings and diffusing said carriers to form shallow source regions which diffuse laterally to underlie said thin gate dielectric and bound the inner edge of said low concentration channel region;

and forming a source electrode on said source regions and a drain electrode which is electrically connected to said chip.

2. The method of claim 1 further comprising the step of forming a further mask layer prior to said step of introducing carriers of said first conductivity type, said further mask layer having openings through which said carriers of said first conductivity type are introduced into said exposed surface of said chip.

3. The method of claim 1, which includes the further step of reducing the carrier lifetime of said semiconductor chip.

4. The method of claim 1, in which said carriers of said first type which are introduced into said exposed surface of said chip are diffused to a final depth which is reached by a diffusion at about 1175° C. for about 12 hours.

5. The method of claim 4, which includes the further step of reducing the carrier lifetime of said semiconductor chip.

6. The method of claim 1, wherein said complete chip is exposed to a radiation dose of about 4 megarads.

7. The method of claim 4, wherein said completed chip is exposed to a radiation dose of about 5 to 16 megarads.

8. The method of claim 1, which includes the further step of diffusing heavy metal atoms into said chip to kill carrier lifetime.

9. The method of claim 8 wherein said heavy metal atoms are platinum about which are diffused at a temperature of about 960° C. to 970° C.

10. The method of claim 4, which includes the further step of diffusing heavy metal atoms into said chip to kill carrier lifetime.

11. The method of claim 10, wherein said heavy metal atoms are platinum atoms which are diffused at a temperature of about 955° C.

12. The method of claim 10, wherein said heavy metal atoms are gold atoms.

* * * * *